(12) United States Patent
Fan

(10) Patent No.: US 9,317,025 B2
(45) Date of Patent: Apr. 19, 2016

(54) PARAMETER SELECTION AND CALCULATION SYSTEM FOR CONTROL VALVES

(71) Applicant: Yi-Ming Fan, Taoyuan Hsien (TW)

(72) Inventor: Yi-Ming Fan, Taoyuan Hsien (TW)

(73) Assignee: JDV CONTROL VALVES CO., LTD., Yangmei, Taoyuan County (TW)

( * ) Notice: Subject to any disclaimer, the term of this patent is extended or adjusted under 35 U.S.C. 154(b) by 391 days.

(21) Appl. No.: 14/062,910

(22) Filed: Oct. 25, 2013

(65) Prior Publication Data

US 2015/0120065 A1    Apr. 30, 2015

(51) Int. Cl.
*G05D 7/00*    (2006.01)
*G05B 15/02*    (2006.01)
*G06F 17/50*    (2006.01)

(52) U.S. Cl.
CPC ............... *G05B 15/02* (2013.01); *G06F 17/50* (2013.01)

(58) Field of Classification Search
None
See application file for complete search history.

(56) References Cited

U.S. PATENT DOCUMENTS

| 7,289,859 | B2 * | 10/2007 | Miwa | G06F 17/50 700/31 |
| 8,589,125 | B2 * | 11/2013 | Mori | G06F 17/5009 703/1 |
| 2006/0016491 | A1 * | 1/2006 | Rosko | F16K 11/0787 137/625.4 |

* cited by examiner

*Primary Examiner* — Kenny Lin
(74) *Attorney, Agent, or Firm* — Muncy, Geissler, Olds & Lowe, P.C.

(57) ABSTRACT

A parameter selection and calculation system for control valves has a file manage unit for integrating and storing the files generated in operation. In that, the control valve specification table for control valves of similar forms can be stored in one control valve design file instead of being stored in various different files. Furthermore, a language selection unit provides the function that a user can select a desire language for operating. Moreover, a user can enter into a numerical input unit for inputting related design parameters for a specific control valve or getting related design parameters by selected proper control valve forms in the control valve design database. Then these data are formed as control valve parameter tables acceptable by the control valve logic operation unit. Then the control valve logic operation unit will operate to get a control valve specification table by using the control valve parameter tables.

6 Claims, 2 Drawing Sheets

PARAMETER SELECTION AND CALCULATION SYSTEM FOR CONTROL VALVES

FIELD OF THE INVENTION

The field of the present invention is related to control valves, and in particular to a parameter selection and calculation system for control valves.

BACKGROUND OF THE INVENTION

In the prior art designs for control valves, software are used widely under the consideration of the shapes, environments, pressures, temperatures and flows of the control valves. Furthermore, in design of the control valves, parameters for the control valves are important. Further, in the prior art control valve design software, each file is only related to one control valve of specific form which is required for users. However, it is difficult for the user to find files for control valves which are related in some parameters. This is because each file only stores a kind of control valve. Therefore, a user must take a long time to find the desired files for related control valves.

Furthermore, the prior art software has no function of language selection. This causes the convenience to users. Further, it is often that each time that the user needs to input the parameters for design of a specific control valve, even some control valves have similar design parameters. This causes the design works to be complicated and time consumed.

SUMMARY OF THE INVENTION

Accordingly, the object of the present invention is to provide a parameter selection and calculation system for control valves, wherein a file manage unit serves to integrate and store the files generated in the operation of the present invention. By the present invention, the control valve parameter design sets for control valves of similar forms can be stored in one control valve design file instead of being stored in various different files. Furthermore, the language selection unit provides the function that a user can select a desire language for operating the system of the present invention. Moreover, by the present invention, a user can enter into the numerical input unit through the user selection interface for input related design parameters for a specific control valve or getting related design parameters by selected proper control valve forms in the control valve design database 241.

To achieve above object, the present invention provides a parameter selection and calculation system for control valves comprising: a server connected to a user input device, the server including a processor and a memory; the processor serving to process the required operations of the system; and the memory serving to store the software and data used in the system; a plurality of functional units being performed by the server; the functional unit comprising: a user selection interface connected to the user input device; the user selection interface performs related operations according to the contents from the user input device; a file manage unit connected to the user selection interface for generating a plurality of control valve design files; one control valve design file containing one or a plurality of control valve specification table; one control valve specific table being related to design of a control valve of a specific form; the control valve specification tables for control valves of similar forms being stored in one control valve design file instead of being stored in various different files; a numerical input unit connected to the user selection interface; the numerical input unit including a control valve design database which stores a plurality of historical data related to the control valve design parameters for different kinds of control valves; the numerical input unit serving for receiving the data about the building of control valve parameter tables; the control valve parameter table having the data about the parameters of a control valve to be designed; and a control valve logic operation unit connected to the numerical input unit; the control valve logic operation unit having operation logics; by the control logic therein and he contents in the control valve parameter table in the numerical input unit, the control valve logic operation unit forming a control valve specification table; and the control valve specification table having the data for making a control valve; the control valve specification table being transferred to the file manage unit for forming the control valve design files.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
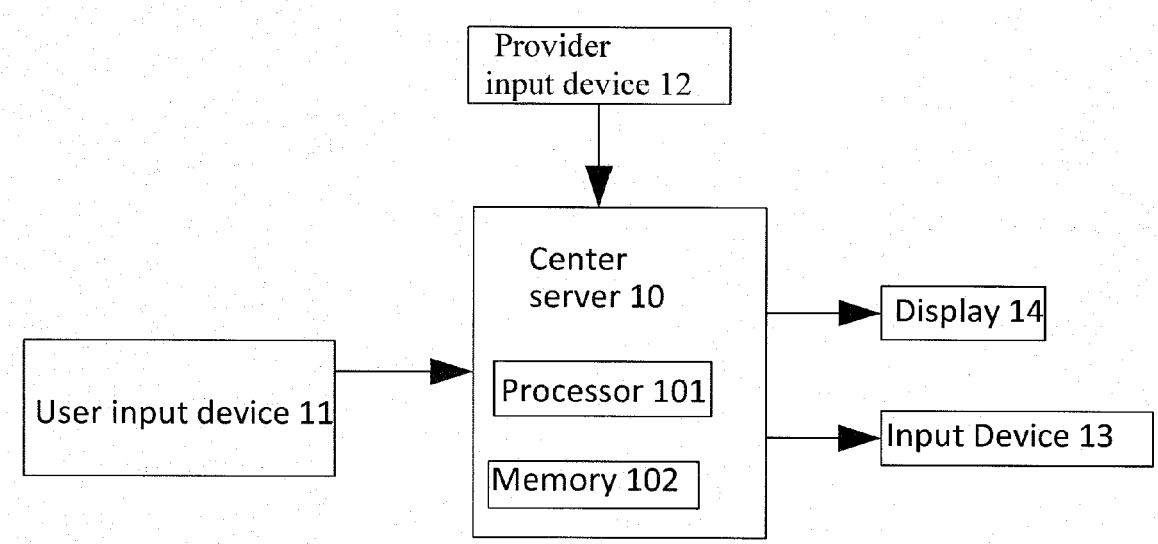
FIG. 1 shows the hardware structure of the present invention.

With reference to FIG. 1 the hardware structure of the present invention includes a center server 10 which is connected to a user input device 11, a provider input device 12, an output device 113 and a display 14. The central processing unit 10 includes a processor 101 and a memory 102. The processor 101 serves to process the required operations of the present invention. The memory 102 serves to store the software and data used in the present invention. The display 14 serves to display the results and related data of the present invention.

Figure 2:
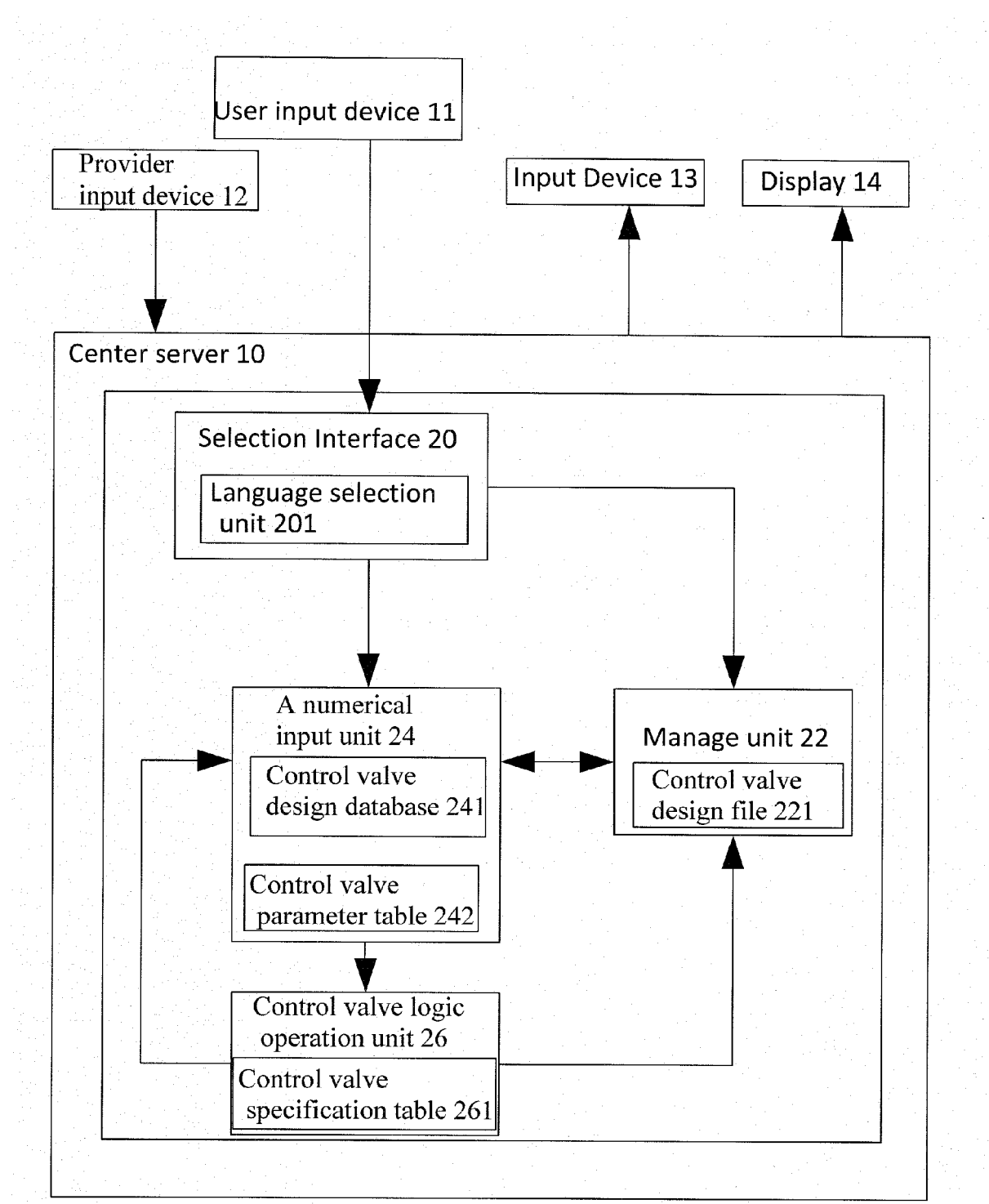
FIG. 2 is a schematic view about the structure of the present invention.

With reference to FIG. 2, the structure about the parameter selection and calculation system for control valves according to the present invention is illustrated. The present invention has the following elements.

A user selection interface 20 is connected to the user input device 11. The user selection interface 20 performs related operations according to the contents from the user input device 11. The user selection interface 20 further includes a language selection unit 201 for determining the language (such as Chinese, English, Germany, etc.) for operating the system based on the inputs from the user selection interface 20.

A file manage unit 22 is connected to the user selection interface 20 for setting a plurality of control valve design files 221. The file manage unit 22 generates control valve design files 221. One control valve design file 221 contains one or a plurality of control valve specification table 261. One control valve specific table 261 (see the description said below) is related to the design of a control valve of a specific form. Therefore, by the present invention, the control valve specification tables 261 for control valves of similar forms can be stored in one control valve design file 221 instead of being stored in various different files. This design is convenient in file management and classification. In use, the system of the present invention can directly enter into one specific control valve specification table 261 in one control valve design file 221 for getting the desired data.

A numerical input unit 24 is connected to the user selection interface 20. The numerical input unit 24 includes a control valve design database 241 which stores a plurality of historical data related to the control valve design parameters for different kinds of control valves, such as classical control valves, or special form control valves.

The numerical input unit 24 serves for receiving the data about the building of control valve parameter tables 242. The control valve parameter table 242 has the data about the parameters of a control valve to be designed, such as flow rates, pressures, temperatures, etc. of a control valve to be designed.

The control valve parameter tables 242 can be modularized. The parameters for the tables are built directly in the system initially or are inputted from users. In design of a control valve, the user can call a specific control valve parameter table and then modifies the table to fit a control valve to be designed. Therefore, the design work is simplified. As stated above, the control valve parameter table 242 can be built by users or is called from the control valve design database 241

A control valve logic operation unit 26 is connected to the numerical input unit 24. The control valve logic operation unit 26 receives the control valve parameter table 242 in the numerical input unit 24 and then by using the calculation logics thereof to derive a control valve specification table 261. The control valve specification table 261 has the data for making a control valve, such as sizes, thickness, materials, etc. of a control valve to be made so that the user can make the control valve based on the data in the control valve specification table 261.

The control valve logic operation unit 26 is connected to the file manage unit 22. The control valve specification table 261 is inputted to the file manage unit 22 so as to form the control valve design files 221 as said above. One control valve design file may store one or a plurality of control valve specification table 261.

After the control valve specification table 261 is built, the control valve specification table 261 is stored with a specific filename and formats which are made to be related to the control valve parameter table 242 for deriving the control valve specification table 261.

If necessary, after one control valve specification table 261 is built, the user can built another one by inputting data to the numerical input unit 24 so as to generate another control valve parameter table 242.

The present invention further includes a provider update unit 30 which is connected to a provider input device 12. In the present invention, the provider is mainly the manufacturers of control valves. Thereby, the provider can update the data in the system, such as types of valves in the control valve design database 241 and the logic rules in the control valve logic operation unit 26.

In use of the present invention, the file manage unit 22 serves to integrate and store the files generated in the operation of the present invention. By the present invention, the control valve specification table 261 for control valves of similar forms can be stored in one control valve design file 221 instead of being stored in various different files. Furthermore, the language selection unit 201 provides the function that a user can select a desire language for operating the system of the present invention. Moreover, by the present invention, a user can enter into the numerical input unit 24 through the user selection interface 20 for input related design parameters for a specific control valve or getting related design parameters by selected proper control valve forms in the control valve design database 241. Then these data are formed as control valve parameter tables 242 acceptable by the control valve logic operation unit 26. Then the control valve logic operation unit 26 will operate to get a control valve specification table 261 by using the control valve parameter tables 242. After operation, the user can get another control valve parameter 242 from another kind of control valve by using above mentioned process.

The object of the present invention is to improve the operation structure for control valves in the prior art. The file manage unit causes the parameters for control valves to be stored orderly and logically. Therefore, the user can search desired files quickly and easily.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A parameter selection and calculation system for control valves comprising:
    a server connected to a user input device, the server including a processor and a memory; the processor serving to process the required operations of the system; and the memory serving to store the software and data used in the system;
    a plurality of functional units being performed by the server; the functional unit comprising:
    a user selection interface connected to the user input device; the user selection interface performs related operations according to the contents from the user input device;
    a file manage unit connected to the user selection interface for generating a plurality of control valve design files; one control valve design file containing one or a plurality of control valve specification table; one control valve specific table being related to design of a control valve of a specific form; the control valve specification tables for control valves of similar forms being stored in one control valve design file instead of being stored in various different files;
    a numerical input unit connected to the user selection interface; the numerical input unit including a control valve design database which stores a plurality of historical data related to the control valve design parameters for different kinds of control valves;
    the numerical input unit serving for receiving the data about the building of control valve parameter tables; the control valve parameter table having the data about the parameters of a control valve to be designed; and
    a control valve logic operation unit connected to the numerical input unit; the control valve logic operation unit having operation logics; by the control logic therein and he contents in the control valve parameter table in the numerical input unit, the control valve logic operation unit forming a control valve specification table; and the control valve specification table having the data for making a control valve; the control valve specification table being transferred to the file manage unit for forming the control valve design files.

2. The parameter selection and calculation system for control valves as claimed in claim 1, wherein the user selection interface further includes a language selection unit for determining the language for operating the system based on the inputs from the user selection interface.

3. The parameter selection and calculation system for control valves as claimed in claim 1, wherein the control valve parameter tables are modularized; the parameters for the tables are built directly in the system initially or are inputted from users; in design of a control valve, the user can call a specific control valve parameter table and then modifies the table to fit a control valve to be designed; and the control valve parameter table is built by users or is called from the control valve design database.

4. The parameter selection and calculation system for control valves as claimed in claim 1, wherein the control valve logic operation unit is connected to the file manage unit; after the control valve specification table is built; the control valve specification table is stored with a specific filename and formats which are made to be related to the control valve parameter table for deriving the control valve specification table.

5. The parameter selection and calculation system for control valves as claimed in claim 1, wherein if necessary, after one control valve specification table is built, the user can build another one by inputting data to the numerical input unit so as to generate another control valve parameter table.

6. The parameter selection and calculation system for control valves as claimed in claim 1, further comprising a provider update unit connected to a provider input device; and the provider can update the data in the system.

* * * * *